US012663707B2

(12) United States Patent
Kim et al.

(10) Patent No.: US 12,663,707 B2
(45) Date of Patent: Jun. 23, 2026

(54) PHASE SHIFT BLANKMASK AND PHOTOMASK FOR EUV LITHOGRAPHY

(71) Applicant: S&S TECH Co., Ltd., Daegu-si (KR)

(72) Inventors: Yong-Dae Kim, Daegu (KR);
Chul-Kyu Yang, Daegu-si (KR);
Mi-Kyung Woo, Daegu-si (KR)

(73) Assignee: S&S TECH Co., Ltd., Daegu-si (KR)

( * ) Notice: Subject to any disclaimer, the term of this patent is extended or adjusted under 35 U.S.C. 154(b) by 642 days.

(21) Appl. No.: 18/101,000

(22) Filed: Jan. 24, 2023

(65) Prior Publication Data

US 2024/0126163 A1       Apr. 18, 2024

(30) Foreign Application Priority Data

Oct. 13, 2022     (KR) ......................... 10-2022-0131244

(51) Int. Cl.
*G03F 1/22*        (2012.01)
*G03F 1/24*        (2012.01)
*G03F 1/26*        (2012.01)

(52) U.S. Cl.
CPC .................. *G03F 1/26* (2013.01); *G03F 1/22* (2013.01); *G03F 1/24* (2013.01)

(58) Field of Classification Search
CPC ...................................... G03F 1/22; G03F 1/24
See application file for complete search history.

(56) References Cited

U.S. PATENT DOCUMENTS

| | | | |
|---|---|---|---|
| 11,940,725 B2 * | 3/2024 | Shin | G03F 1/32 |
| 2011/0027703 A1 | 2/2011 | Shoki | |
| 2021/0223681 A1 | 7/2021 | Ikebe et al. | |
| 2022/0043335 A1 | 2/2022 | Ohkubo et al. | |
| 2022/0121102 A1 | 4/2022 | Shoki et al. | |
| 2022/0236635 A1 | 7/2022 | Shin et al. | |
| 2022/0269160 A1 | 8/2022 | Kim et al. | |
| 2023/0116213 A1 * | 4/2023 | Lee | G03F 1/48 |
| | | | 359/359 |
| 2024/0126162 A1 * | 4/2024 | Kim | G03F 1/24 |

FOREIGN PATENT DOCUMENTS

| | | | | |
|---|---|---|---|---|
| DE | 102006046000 A1 * | 8/2007 | ............... | G03F 1/22 |
| JP | 2010009001 A | 1/2010 | | |
| JP | 2022064956 A | 4/2022 | | |
| JP | 2022115074 A | 8/2022 | | |
| JP | 2022130293 A | 9/2022 | | |
| KR | 1020120057502 A | 6/2012 | | |

(Continued)

*Primary Examiner* — Martin J Angebranndt
(74) *Attorney, Agent, or Firm* — WILLIAM PARK AND ASSOCIATES LTD.

(57)        ABSTRACT

Disclosed is a blankmask for EUV lithography, including a reflective film, a capping film, an etch stop film, a phase shift film, and a hard mask film which are sequentially formed on a substrate. The phase shift film contains ruthenium (Ru), and the etch stop film contains chrome (Cr) and niobium (Nb). In the etch stop film, the content of niobium (Nb) ranges from 20 to 50 at %, and the content of chrome (Cr) ranges from 10 to 40 at %. The hard mask film contains tantalum (Ta) and oxygen (O). The content of tantalum (Ta) in the hard mask film is higher than or equal to 50 at %. With the blankmask, it is possible to implement a high resolution and NILS during wafer printing, and implement DtC.

9 Claims, 2 Drawing Sheets

(56)          References Cited

FOREIGN PATENT DOCUMENTS

| KR | 20220108686 A | * | 8/2022 | ............... | G03F 1/26 |
|----|----|----|----|----|----|
| KR | 1020220108303 A | | 8/2022 | | |
| KR | 1020220108686 A | | 8/2022 | | |
| KR | 1020220121399 A | | 9/2022 | | |
| KR | 1020220121401 A | | 9/2022 | | |
| KR | 20220168093 A | * | 12/2022 | ............... | G03F 1/26 |
| TW | 202238253 A | | 10/2022 | | |
| WO | 2009122972 A1 | | 10/2009 | | |
| WO | WO-2019225737 A1 | * | 11/2019 | ............... | G03F 7/20 |
| WO | WO-2024112062 A1 | * | 5/2024 | ............... | G03F 1/38 |

* cited by examiner

PHASE SHIFT BLANKMASK AND PHOTOMASK FOR EUV LITHOGRAPHY

CROSS-REFERENCE TO RELATED THE APPLICATION

This application is based on and claims priority under 35 U.S.C. § 119(a) to Korean Patent Application No. 10-2022-0131244, filed on Oct. 13, 2022 in the Korean Intellectual Property Office, the disclosure of which is incorporated by reference herein in its entirety.

FIELD

The disclosure relates to a blankmask and a photomask, and more particularly to a phase shift blankmask, which includes a phase shift film for shifting a phase with respect to extreme ultraviolet (EUV) light to implement high resolution during wafer printing, and a photomask prepared using the same for EUV lithography.

DESCRIPTION OF THE RELATED ART

Technology of lithography for a semiconductor has recently developed from ArF, ArFi multiple (MP) lithography to extreme ultraviolet (EUV) Lithography. A blankmask used for the EUV lithography generally includes two thin films on a substrate, such as a reflective film for reflecting EUV light and an absorption film for absorbing the EUV light.

Recently, attempts have been made to develop a phase shift blankmask capable of implementing a higher resolution than such a binary blankmask having the absorption film. The phase shift blankmask has a higher normalized image log slope (NILS) than the binary blankmask, and thus reduces a stochastic defect due to a shot noise effect during wafer printing. Further, the phase shift blankmask implements low dose to clear (DtC), thereby increasing semiconductor productivity.

In the phase shift blankmask for the EUV lithography, it is preferable that the phase shift film is prepared using a material that makes it easy to prepare a photomask and is excellent in performance during wafer printing. In this regard, ruthenium (Ru) has been researched as the material of the phase shift film.

FIG. 1 is a view showing a structure of a phase shift blankmask for the EUV lithography, with a phase shift film containing ruthenium (Ru). The structure of FIG. 1 shows the applicant's own technology as opposed to the disclosure in order to describe the technical features of the disclosure, and it does not mean that the structure of FIG. 1 set forth herein has been publicly known prior to the filing of the disclosure.

The phase shift blankmask for the EUV lithography includes a substrate 102, a reflective film 104 formed on the substrate 102, a capping film 105 formed on the reflective film 104, an etch stop film 107 formed on the capping film 105, a phase shift film 108 formed on the etch stop film 107, a hard mask film 109 formed on the phase shift film 108, and a resist film 110 formed on the hard mask film 109.

The capping film 105 is generally made of a material containing ruthenium (Ru), and the phase shift film 108 is also made of a material containing ruthenium (Ru), specifically, RuON.

The etch stop film 107 has a two-layered structure, i.e., includes a first layer 107a formed on the capping film 105, and a second layer 107b formed on the and the first layer 107a. The first layer 107a is made of TaBN, and the second layer 107b is made of TaBO.

The hard mask film 109 contains TaBO.

To prepare a photomask using the foregoing blankmask, a pattern of the resist film 110 is first formed through e-beam writing and developing processes, and the resist film pattern is then used as an etch mask to etch the hard mask film 109 of TaBO, thereby forming a hard mask film pattern. In this case, fluorine (F)-based gas is used as etching gas. Then, the resist film pattern is removed, and the hard mask film pattern is used as the etch mask to etch the phase shift film 108 with chlorine ($Cl_2$)-based gas containing oxygen ($O_2$).

Meanwhile, tantalum (Ta) is etched by chlorine-based gas, but, tantalum (Ta) added with oxygen (O) is etched by fluorine (F)-based gas. Therefore, in a process of etching the etch stop film 107, the second layer 107b of TaBO is first etched by fluorine-based gas, and in this case the pattern of the hard mask film 109 is etched together and removed. Then, the first layer 107a of the etch stop film 107 is etched by chlorine ($Cl_2$)-based gas without containing oxygen ($O_2$). Thus, the phase shift photomask is completed.

In the phase shift blankmask having the foregoing structure, the phase shift film 108 containing ruthenium (Ru) is etched by chlorine-based gas, and in this case chlorine ($Cl_2$)-based gas containing oxygen ($O_2$) is used to secure a predetermined etch rate or higher. However, in the structure of FIG. 1, the capping film 105 and the phase shift film 108 contain ruthenium (Ru) in common. Therefore, if the etch stop film 107 is not present, oxygen ($O_2$) contained in an etching material for patterning the phase shift film 108 causes damage to the capping film 105 during etching, thereby decreasing the reflectivity of the capping film 105. The etch stop film 107 prevents the chlorine ($Cl_2$)-based gas containing oxygen ($O_2$) from coming into contact with the capping film 105, thereby preventing the damage to the capping film 105.

However, when the phase shift film 107 contains Ru, it is preferable that the etch stop film 107 is formed to have the two-layered structure as described above. If the etch stop film 107 is formed as a single layer of TaBN, TaBN is vulnerable to oxidation and therefore the surface of the etch stop film 107 is oxidized by oxygen ($O_2$) while the phase shift film 108 of RuON is etched. Such oxidation is randomly distributed, thereby causing a defect on the surface of the etch stop film 107, and also decreasing the etch rate during the etching using chlorine ($Cl_2$)-based gas. Meanwhile, the etching using chlorine ($Cl_2$)-based gas is generally regarded as chemical etching, and the etching using fluorine (F)-based gas is generally regarded as physical etching. Therefore, if the etch stop film 107 is formed as a single layer of TaBO, the capping film 105 is physically damaged during the etching using fluorine (F)-based gas. In this regard, the first layer 107a is made of TaBN and the second layer 107b is made of TaBO, thereby preventing the capping film 105 from being damaged by oxygen ($O_2$) and fluorine (F)-based gas.

As the etch stop film 107 has the two-layered structure, processes for forming the layers 107a and 107b of the etch stop film 107 are separately performed, thereby increasing a total number of processes. Therefore, there are problems of increasing the complexity of thin film design, requiring cleaning and defect control for the additional thin film, etc. Besides, the cleaning and the like additional process are required even for a photomask prepared using this blankmask. Such problems eventually act as a cause of decreasing yield.

Further, in the foregoing structure, the hard mask film 109 is removed while etching the second layer 107*b* of the etch stop film 107, and thus the phase shift film 108 containing ruthenium (Ru) is positioned on the top. However, ruthenium (Ru) has high surface reflectivity to deep ultraviolet (DUV) inspection light having a wavelength of 193 nm, and thus causes a problem of lowering inspection sensitivity during inspection using the DUV inspection light. To solve this problem, in the structure of FIG. 1, oxygen (O) may be added to ruthenium (Ru), thereby lowering the surface reflectivity of the phase shift film 108. However, when oxygen (O) is added to ruthenium (Ru), a problem of increasing a refractive index (n) occurs, and it is therefore difficult to implement a phase shift amount required in the phase shift film 108.

SUMMARY

An aspect of the disclosure is to improve inspection sensitivity with respect to deep ultraviolet (DUV) inspection light while implementing a phase shift amount required in a blankmask including a phase shift film containing ruthenium (Ru), and further simplify a process of forming a thin film and increase a yield by decreasing the number of thin films.

According to an embodiment of the disclosure, there is provided a blankmask for extreme ultraviolet (EUV) lithography, including a substrate, a reflective film formed on the substrate, a capping film formed on the reflective film, an etch stop film formed on the capping film, and a phase shift film formed on the etch stop film. The phase shift film contains ruthenium (Ru), and the etch stop film contains chrome (Cr) and niobium (Nb).

In the etch stop film, the content of niobium (Nb) may range from 20 to 50 at %, and the content of chrome (Cr) may range from 10 to 40 at %.

The etch stop film may further contain nitrogen (N).

The content of nitrogen (N) in the etch stop film may range from 10 to 70 at %.

The etch stop film may have a thickness of 15 nm or less.

The blankmask may further include a hard mask film formed on the phase shift film.

The hard mask film may contain tantalum (Ta) and oxygen (O).

The content of tantalum (Ta) in the hard mask film may be higher than or equal to 50 at %.

The hard mask film may further contain boron (B).

The content of boron (B) in the hard mask film may be lower than or equal to 20 at %.

The hard mask film may have a thickness of 2 to 5 nm.

The hard mask film may have a reflectivity of 40% or lower with respect to deep ultraviolet (DUV) inspection light having a wavelength of 193 nm.

According to another embodiment of the disclosure, there is provided a photomask for extreme ultraviolet (EUV) lithography, prepared using the foregoing blankmask.

According to still another embodiment of the disclosure, there is provided a method of preparing a photomask for extreme ultraviolet (EUV) lithography, using the foregoing blankmask, the method including: a) forming a resist film pattern on the hard mask film; b) etching the hard mask film by fluorine-based etching gas while using the resist film pattern as an etch mask; c) removing the resist film pattern; d) etching the phase shift film by chlorine-based etching gas containing oxygen while using a pattern of the hard mask film as an etch mask; and e) etching the etch stop film by chlorine-based etching gas containing no oxygen while using the pattern of the hard mask film and a pattern of the phase shift film as etch masks.

BRIEF DESCRIPTION OF THE DRAWINGS

The above and/or the aspects will become apparent and more readily appreciated from the following description of exemplary embodiments, taken in conjunction with the accompanying drawings, in which.

DETAILED DESCRIPTION OF EXEMPLARY EMBODIMENTS

Below, the disclosure will be described in more detail with reference to the accompanying drawings.

Figure 2:
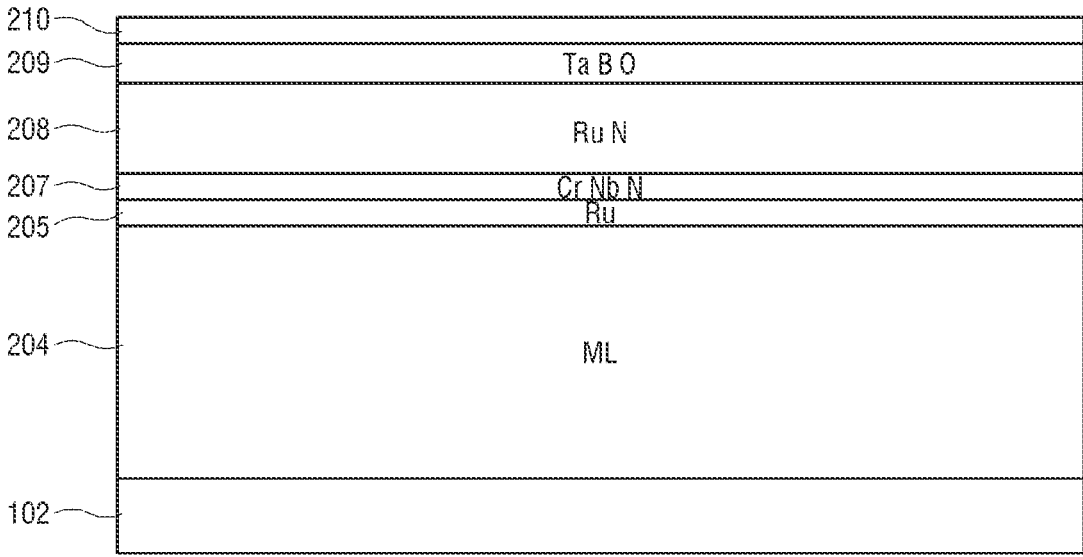
FIG. 2 is a view showing a phase shift blankmask for extreme ultraviolet (EUV) lithography according to the disclosure.

FIG. 2 is a view showing a phase shift blankmask for extreme ultraviolet (EUV) lithography according to the disclosure.

The phase shift blankmask for the EUV lithography according to the disclosure includes a substrate 202, a reflective film 204 formed on the substrate 202, a capping film 205 formed on the reflective film 204, a phase shift film 208 formed on the capping film 205, and a resist film 210 formed on the phase shift film 208.

The substrate 202 is configured as a low thermal expansion material (LTEM) substrate that has a low thermal expansion coefficient within a range of $0\pm1.0\times10^{-7}/^\circ$ C., preferably, $0\pm0.3\times10^{-7}/^\circ$ C. to prevent deformation and stress of a pattern due to heat during exposure so as to be suitable for a glass substrate for a reflective blank mask using EUV exposure light. As a material of the substrate 202, $SiO_2$—$TiO_2$ based glass, multicomponent glass-ceramic, etc. may be used.

The reflective film 204 has a multilayered structure in which layers are different in the refractive index, and functions to reflect the EUV exposure light. Specifically, the reflective film 204 is formed of 40 to 60 layers by alternately stacking an Mo layer and a Si layer.

The capping film 205 serves to prevent an oxide film from being formed on the reflective film 204 in order to maintain the reflectivity of the reflective film 204 to the EUV exposure light, and prevent the reflective film 204 from being etched while an etch stop film 207 is patterned. In general, the capping film 205 is made of a material containing ruthenium (Ru). The capping film 205 is formed to have a thickness of 2 to 5 nm. When the thickness of the capping film 205 is less than or equal to 2 nm, it is difficult to function as the capping film 205. When the thickness of the capping film 205 is more than or equal to 5 nm, the reflectivity to the EUV exposure light is lowered.

The phase shift film 208 shifts the phase of the exposure light and reflects the exposure light, thereby destructively interfering with the exposure light reflected from the reflective film 204. The phase shift film 208 contains ruthenium (Ru), and thus the phase shift film 208 is etched by chlorine ($Cl_2$)-based gas. In particular, to secure the etch rate, the phase shift film 208 is etched by chlorine ($Cl_2$)-based gas containing oxygen ($O_2$). Preferably, the phase shift film 208 further contains nitrogen (N). Because nitrogen (N) increases the refractive index of the phase shift film (N), the content of nitrogen (N) needs to be selected appropriately. Preferably, the content of nitrogen (N) is lower than or equal to 40 at %, and thus the content of ruthenium (Ru) in the phase shift film 208 is higher than or equal to 60 at %.

The phase shift film 208 has a relative reflectivity of 6 to 15% to the reflective film 204 with respect to the exposure light having a wavelength of 13.5 nm. Here, the relative reflectivity refers to a ratio of the reflectivity of the phase shift film 208 to the reflectivity of the structure where the reflective film 204 and the capping film 205 are stacked. Further, the phase shift film 208 has a phase shift amount of 180 to 220°, preferably, 185 to 220°. The phase shift film 208 has a thickness of 50 nm, preferably a thickness of 45 nm or lower.

A hard mask film 209 is used as an etch mask while the phase shift film 208 is etched. To this end, the hard mask film 209 is made of a material that has etch selectivity to the phase shift film 208. Further, according to the disclosure, the hard mask film 209 is used for inspection using deep ultraviolet (DUV) inspection light, and therefore made of a material that has a low reflectivity.

In this regard, according to the disclosure, the hard mask film 209 is made of a material containing tantalum (Ta), and additionally containing oxygen (O) so as to be etched by fluorine (F)-based gas. In this case, the content of tantalum (Ta) in the hard mask film 209 may be higher than or equal to 50 at %.

The hard mask film 209 further contains boron (B). The content of boron (B) in the hard mask film 209 is lower than or equal to 20 at %, preferably 15 at %. The hard mask film 209 has a thickness of 5 nm or less, preferably a thickness of 2 to 4 nm.

The hard mask film 209 has a reflectivity of 40% or lower, preferably 35% or lower with respect to the DUV inspection light having a wavelength of 193 nm.

The etch stop film 207 serves to protect the capping film 205 while the phase shift film 208 is etched. After etching the phase shift film 208, the etch stop film 207 is etched while using the pattern of the hard mask film 209 and the pattern of the phase shift film 208 as the etch masks. In this case, to prevent damage to the capping film 205, the etch stop film 207 is etched by gas that does not contain oxygen ($O_2$). Further, to prevent the pattern of the hard mask film 209 from being removed while the etch stop film 207 is etched, the etch stop film 207 needs to have the etch selectivity to the hard mask film 209. Therefore, the etch stop film 207 may be etched by chlorine ($Cl_2$)-based gas without containing oxygen ($O_2$).

According to the disclosure, the etch stop film 207 is made of a material containing chrome (Cr) and niobium (Nb). Preferably, the etch stop film 207 further contains nitrogen (N). In the etch stop film 207, the contain of niobium (Nb) may range from 20 to 50 at %, the content of chrome (Cr) may range from 10 to 40 at %, and the content of nitrogen (N) may range from 10 to 70 at %. When the content of niobium (Nb) is lower than or equal to 20 at %, the etch stop film 207 is decreased in the etch rate. When the content of niobium (Nb) is higher than or equal to 50 at %, a chemical cleaning process is decreased in efficiency. When the content of nitrogen (N) is lower than or equal to 10 at %, the line edge roughness (LER) is decreased.

The etch stop film 207 has a thickness of 20 nm or less, preferably 15 nm or less.

The resist film 210 is configured as a chemically amplified resist (CAR). The resist film 210 has a thickness of 40 to 100 nm, preferably, 40 to 80 nm.

With the foregoing structure, the blankmask has advantages as follows.

The hard mask film 209 remains after the photomask is prepared, and has low reflectivity, thereby having high contrast with respect to the DUV inspection light. Therefore, the hard mask film 209 functions as an inspection film for the DUV inspection light.

Figure 1:
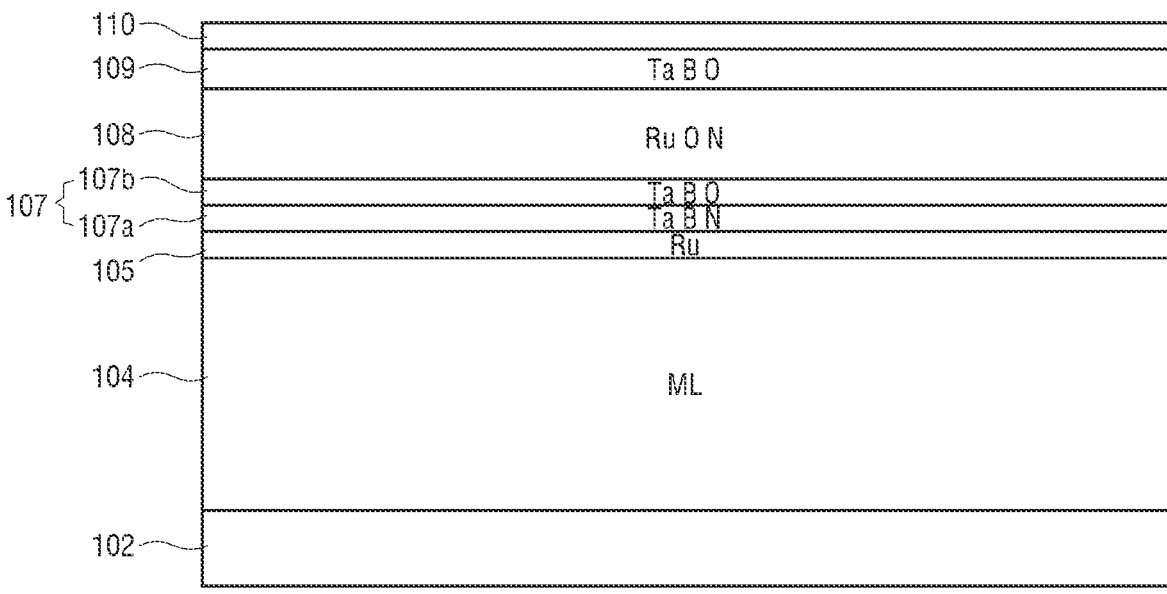
FIG. 1 is a view showing a structure of a phase shift blankmask for extreme ultraviolet (EUV) lithography.

Because the hard mask film 209 serves as the inspection film, it is not necessary to lower the surface reflectivity of the phase shift film 208 unlike the case where the hard mask film 209 is removed as shown in FIG. 1. Therefore, the phase shift film 208 may be made of a material that contains ruthenium (Ru) but does not contain oxygen (O), and it is thus easy to control the refractive index (n) of the phase shift film 208 so that a required phase shift amount can be easily implemented. While the phase shift film 108 of RuON in the configuration of FIG. 1 has a high refractive index of about 0.91, the phase shift film 208 of RuN in the configuration of FIG. 2 has a refractive index of 0.88 to 0.90. Further, the phase shift film 208 does not contain oxygen (O), and therefore NILS and DtC are improved.

Selectively, the hard mask film 209 may be removed by a separate process. In this case, for the inspection using the DUV inspection light, oxygen (O) may be additionally contained in the phase shift film 208.

CrNb of the etch stop film 207 has the refractive index (n) and the extinction coefficient (k) lower than those of TaBN/TaBO of FIG. 1. Thus, NILS and DtC are more improved than those of FIG. 1.

A process of preparing a photomask using the foregoing blankmask is as follows.

First, a pattern of the resist film 210 was formed by e-beam writing and developing processes, and then the resist film pattern was used as the etch mask to etch the hard mask film 209. To etch the hard mask film 209, fluorine (F)-based etching gas is used.

The resist film pattern was removed, and the pattern of the hard mask film 209 was used as the etch mask to etch the phase shift film 208. To etch the phase shift film 208, chlorine ($Cl_2$)-based etching gas containing oxygen ($O_2$) is used.

The pattern of the hard mask film 209 and the pattern of the phase shift film 208 are used as the etch masks to etch the etch stop film 207. To etch the etch stop film 207, chlorine ($Cl_2$)-based gas that does not contain oxygen ($O_2$) is used. Specifically, an end point of etching the phase shift film 208 by chlorine ($Cl_2$)-based gas containing oxygen ($O_2$) is checked by end point detection (EPD) equipment, and the etch stop film 207 is then etched by chlorine ($Cl_2$)-based gas that does not contain oxygen ($O_2$). Thus, the photomask is completed.

Because chlorine ($Cl_2$)-based etching gas is used for etching both the phase shift film 208 and the etch stop film 207, the pattern of the hard mask film 209 is not etched but remains in the photomask.

In such a process, the patterning for the etch stop film is performed by one etching process. Therefore, the process is simplified as compared with the process of using the blankmask of FIG. 1.

According to the disclosure, it is possible to implement the characteristics, i.e., high resolution and NILS required for a phase shift blankmask for the EUV during wafer printing, and implement a low DtC.

Further, according to the disclosure, a blankmask with a phase shift film containing ruthenium (Ru) includes fewer thin films than a conventional one and has high inspection sensitivity to DUV light.

Although details of the disclosure have been described above through a few embodiments of the disclosure with reference to the accompanying drawings, the embodiments are merely for the illustrative and descriptive purposes only but not construed as limiting the scope of the disclosure defined in the appended claims. It will be appreciated by a person having ordinary knowledge in the art that various changes and other equivalent embodiments may be made from these embodiments. Thus, the scope of the disclosure should be defined by the technical subject matters of the appended claims.

What is claimed is:

1. A blankmask for extreme ultraviolet (EUV) lithography, comprising a substrate, a reflective film formed on the substrate, a capping film formed on the reflective film, an etch stop film formed on the capping film, a phase shift film formed on the etch stop film, and a hard mask film formed on the phase shift film, wherein the phase shift film consisting of ruthenium (Ru), oxygen (O), and nitrogen (N) or ruthenium (Ru) and nitrogen (N), and the etch stop film containing chrome (Cr), niobium (Nb), and nitrogen (N), wherein content of niobium (Nb) ranges from 20 to 50 at %, content of chrome (Cr) ranges from 10 to 40 at %, and content of nitrogen (N) in the etch stop film ranges from 10 to 70 at %, and the hard mask film contains tantalum (Ta) and oxygen (O).

2. The blankmask of claim 1, wherein the etch stop film has a thickness of 15 nm or less.

3. The blankmask of claim 1, wherein content of tantalum (Ta) in the hard mask film is higher than or equal to 50 at %.

4. The blankmask of claim 3, wherein the hard mask film further contains boron (B).

5. The blankmask of claim 4, wherein content of boron (B) in the hard mask film is lower than or equal to 20 at %.

6. The blankmask of claim 5, wherein the hard mask film has a thickness of 2 to 5 nm.

7. The blankmask of claim 5, wherein the hard mask film has a reflectivity of 40% or lower with respect to deep ultraviolet (DUV) inspection light having a wavelength of 193 nm.

8. A photomask for extreme ultraviolet (EUV) lithography, prepared using the blankmask of claim 1.

9. A method of preparing a photomask for extreme ultraviolet (EUV) lithography, using the blankmask of claim 1, the method comprising:

a) forming a resist film pattern on the hard mask film;

b) etching the hard mask film by fluorine-based etching gas while using the resist film pattern as an etch mask;

c) removing the resist film pattern;

d) etching the phase shift film by chlorine-based etching gas containing oxygen while using a pattern of the hard mask film as an etch mask; and e) etching the etch stop film by chlorine-based etching gas containing no oxygen while using the pattern of the hard mask film and a pattern of the phase shift film as etcl masks, whereby the pattern of the hard mask film remains on the pattern of the phase shift film.

* * * * *